United States Patent [19]
Pratsch et al.

[11] 4,147,975
[45] Apr. 3, 1979

[54] SYNTHETIC TEST CIRCUIT FOR A METAL ENCAPSULATED HIGH VOLTAGE CIRCUIT BREAKER

[75] Inventors: Rudolf Pratsch; Ernst Slamecka, both of Berlin, Fed. Rep. of Germany

[73] Assignee: Siemens Aktiengesellschaft, Munich, Fed. Rep. of Germany

[21] Appl. No.: 821,341

[22] Filed: Aug. 3, 1977

[30] Foreign Application Priority Data

Aug. 25, 1976 [DE] Fed. Rep. of Germany ....... 2638678

[51] Int. Cl.$^2$ .................... G01R 31/02; G01R 31/14
[52] U.S. Cl. .................................. 324/28 CB; 324/54
[58] Field of Search ............................. 324/54, 28 CB

[56] References Cited

U.S. PATENT DOCUMENTS

| | | | |
|---|---|---|---|
| 2,752,590 | 6/1956 | Towle | 324/51 X |
| 2,888,639 | 5/1959 | Petermichl et al. | 324/28 CB |
| 2,898,548 | 8/1959 | Slamecka et al. | 324/28 CB |
| 3,064,183 | 11/1962 | Slamecka | 324/28 CB |
| 4,001,674 | 1/1977 | Schneider | 324/54 |

*Primary Examiner*—Gerard R. Strecker
*Attorney, Agent, or Firm*—Kenyon & Kenyon, Reilly, Carr & Chapin

[57] ABSTRACT

A synthetic test circuit for testing a metal-encapsulated high voltage circuit breaker of a type which is grounded on one side and which includes several switching gaps arranged in series. The testing circuit includes a high voltage source and a high current source for stressing the switching gaps during testing and, in addition, a high voltage means for applying a high voltage to the encapsulation simultaneously with the application thereto of a further voltage from the high voltage source. The high voltage is chosen to be of opposite polarity to the further voltage and the encapsulation is insulated from ground potential during application thereof.

4 Claims, 6 Drawing Figures

SYNTHETIC TEST CIRCUIT FOR A METAL ENCAPSULATED HIGH VOLTAGE CIRCUIT BREAKER

BACKGROUND OF THE INVENTION

1. Field of the Invention

The invention relates to a synthetic test circuit for a metal-encapsulated high-voltage power circuit breaker of a type which is grounded on one side and which includes several switching gaps arranged in series. More particularly, the invention relates to a synthetic test circuit comprising a high-current source and a high-voltage source for stressing the switching gaps which are operated during the test.

2. Description of the Prior Art

In metal-encapsulated high-voltage switching installations for 123 and 245 kV, synthetic test circuits are available which allow testing all the switching gaps which are arranged in series in the circuit breaker. In this connection, what is meant by synthetic is a type of testing in which a relatively low voltage, high current source for passing current through a circuit breaker to be tested and a relatively low power high voltage source for supplying an additional voltage across the terminals of the breaker, when it is open, to simulate the recovery voltage which exists under full voltage, full power conditions are provided. The use of such a test circuit, is based on the recognition that a switch to be tested must be loaded with high current with a closed contact system in which case the magnitude of the voltage is of secondary importance, i.e., it may be comparatively lower. Only when the switch is opened must the returning voltage appear at its contacts. The high load has already ended at this point. This gives rise to the term "synthetic" which means that there is a time staggered effect of current load and voltage load in the circuit breaker to be tested. This type of testing arrangement is disclosed in U.S. Pat. Nos. 3,064,183 and 2,898,548. In U.S. Pat. No. 3,064,183, a system is disclosed in which, as shown on FIG. 1 thereof, in order to test a circuit breaker there is provided a high voltage source 14 comprising a capacitor with an inductance in series. In series with the inductance and capacitor is a spark gap which is controlled by contol apparatus fed by a current transformer. In operation, when the spark gap breaks down, a voltage having the desired characteristics is simulated and applied across the open contacts of the breaker. The system also includes a high current source, feeding a transformer through a switch and a current limiting coil. The secondary of the transformer applies the high current to the circuit breaker in the closed condition. For installations operating at higher voltages of for example, 550kV or more, a test of all switching gaps arranged in series would require considerable expense for building the synthetic test circuit. This expense can be reduced if, instead of all the series-connected switching gaps, only one or some are acted upon by the high-current source and the high-voltage source of the synthetic test circuit. However, in such case, the high-voltage circuit breaker, which is grounded on one side, is tested at only a portion of its rated voltage. While this is of no importance for the testing of the individual switching gaps, it is significant for the testing of the insulation between the switching gaps and the metal encapsulation. More particularly, the test results give no information of the condition of the insulating medium between the open switching gap and the encapsulation because the voltage stress applied is only a portion of the rated voltage of the breaker.

It is, therefore, an object of the present invention to provide a synthetic test circuit which does not suffer the aforesaid disadvantage.

SUMMARY OF THE INVENTION

The above and other objectives are realized in accordance with the principles of the present invention in a synthetic test circuit of the type of U.S. Pat. No. 3,064,183 by further including therein a high-voltage means for generating a voltage of opposite polarity to that of the voltage of the high voltage source for application to the encapsulation of the breaker simultaneously therewith, the latter encapsulation being arranged so as to be insulated from ground potential.

With the synthetic test circuit of the invention so constructed, simultaneous action of a switching gap test voltage and a housing test voltage are obtained, the latter voltages being simultaneously applied in such a manner that the encapsulated high-voltage circuit breaker is tested at voltages corresponding to network conditions. The test voltage at the partial pole, on the one hand, and the sum of the test voltages at the metal encapsulation, on the other hand, can then be selected to be equal or approximately equal to the test voltages prescribed by test specification or the customers' requirements.

BRIEF DESCRIPTION OF THE DRAWINGS

The above and other features and aspects of the present invention will become more apparent upon reading the following detailed description in conjunction with the accompanying drawings in which.

DETAILED DESCRIPTION

Figure 1:
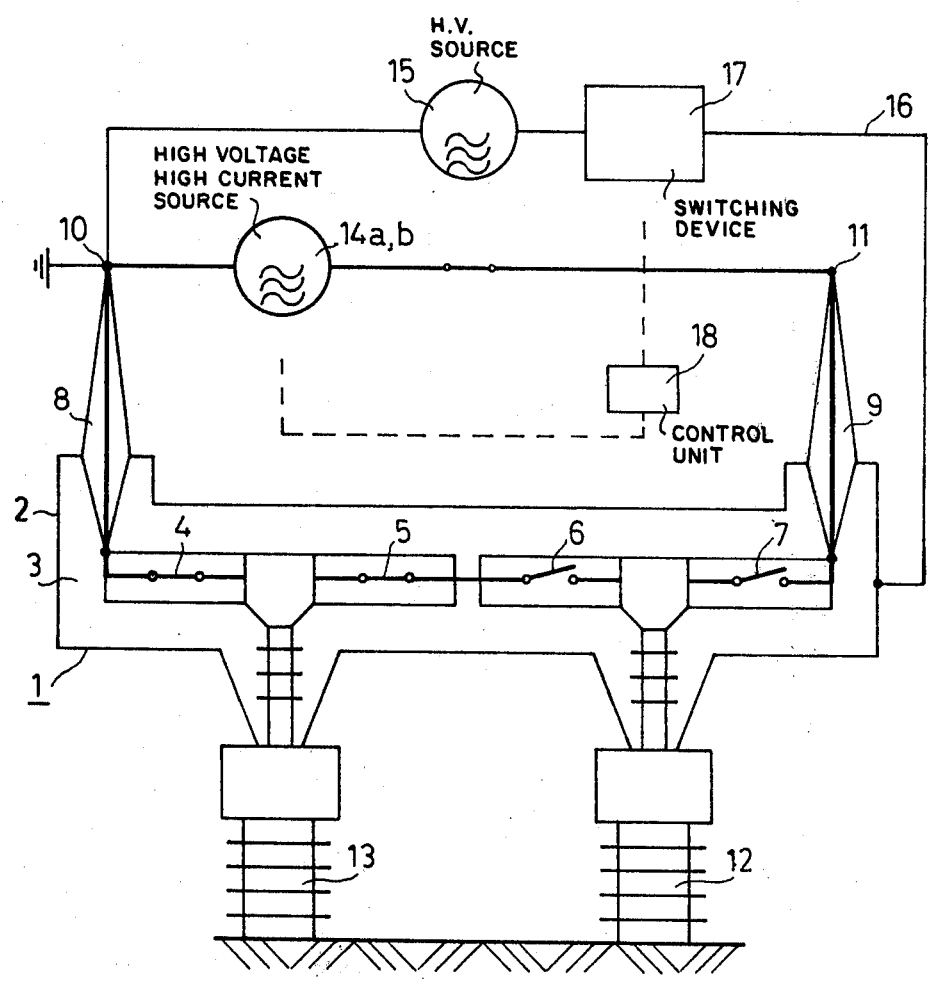
FIG. 1 shows a first embodiment of a synthetic test circuit in accordance with the principles of the present invention wherein the test circuit includes a high voltage circuit including a high-voltage generator.

FIG. 1 shows schematically a metal-encapsulated high-voltage power circuit breaker 1 which includes an encapsulation 2 comprised of an electrically conductive material and filled in its interior 3 with a gaseous insulating medium. Arranged in the interior 3 of the encapsulation 2 are four series-connected switching gaps 4, 5, 6, 7. The series circuit comprising the switching gaps 4 to 7 is connected at opposite ends to the bushings 8 and 9, the outer terminals 10, 11 of which forming the electrical connections of the power circuit breaker 1. The metallic encapsulation 2, which is grounded in the normal operation of the power circuit breaker 1, is insulated from ground by standoff insulators 12, 13 when the breaker is being tested with the synthetic test circuit of the present invention.

As shown in FIG. 1, the terminal 10 of the bushing 8 is grounded, while the terminal 11 of the bushing 9 is connected to a high-current source 14a and a high-voltage source 14b included in the test circuit of the invention. The high current source 14a and high voltage source 14b are constructed in accordance with the aforementioned U.S. Pat. No. 3,064,183. The source 14a and source 14b provide high current and voltage for stressing the switching gaps 6 and 7 during testing of the circuit breaker 1. The test circuit of the invention also includes a high-voltage circuit 15 for generating a high-voltage of opposite polarity to the voltage of source 14b for application to the encapsulation 2. The high-voltage circuit 15 is coupled to the encapsulation 2 via a switching device 17 which is inserted into the line 16 and which is actuated or controlled by a control unit 18. These correspond to the control apparatus and spark gap of the aforementioned U.S. Pat. No. 3,064,183. Synchronously with its control of the switching device 17, the control unit 18 controls application of the voltage and current of the high-current source 14a and the high-voltage source 14b to the series circuit comprised of the switching gaps 4 to 7. More particularly, in the closed condition of the gaps 4 to 7, the high current of the high-current source is effective, while in open condition of the gaps 6 and 7 the high-voltage source 14b becomes effective. During the latter condition, the device 17 is controlled so that the voltage of source 15 is applied to the encapsulation 2, which is now insulated from ground potential via the standoffs 12 and 13. In this manner, with the test circuit of the invention, it is possible to test insulating medium which is arranged in the interior 3 of the encapsulation 2, under rated voltage conditions.

Figure 2:
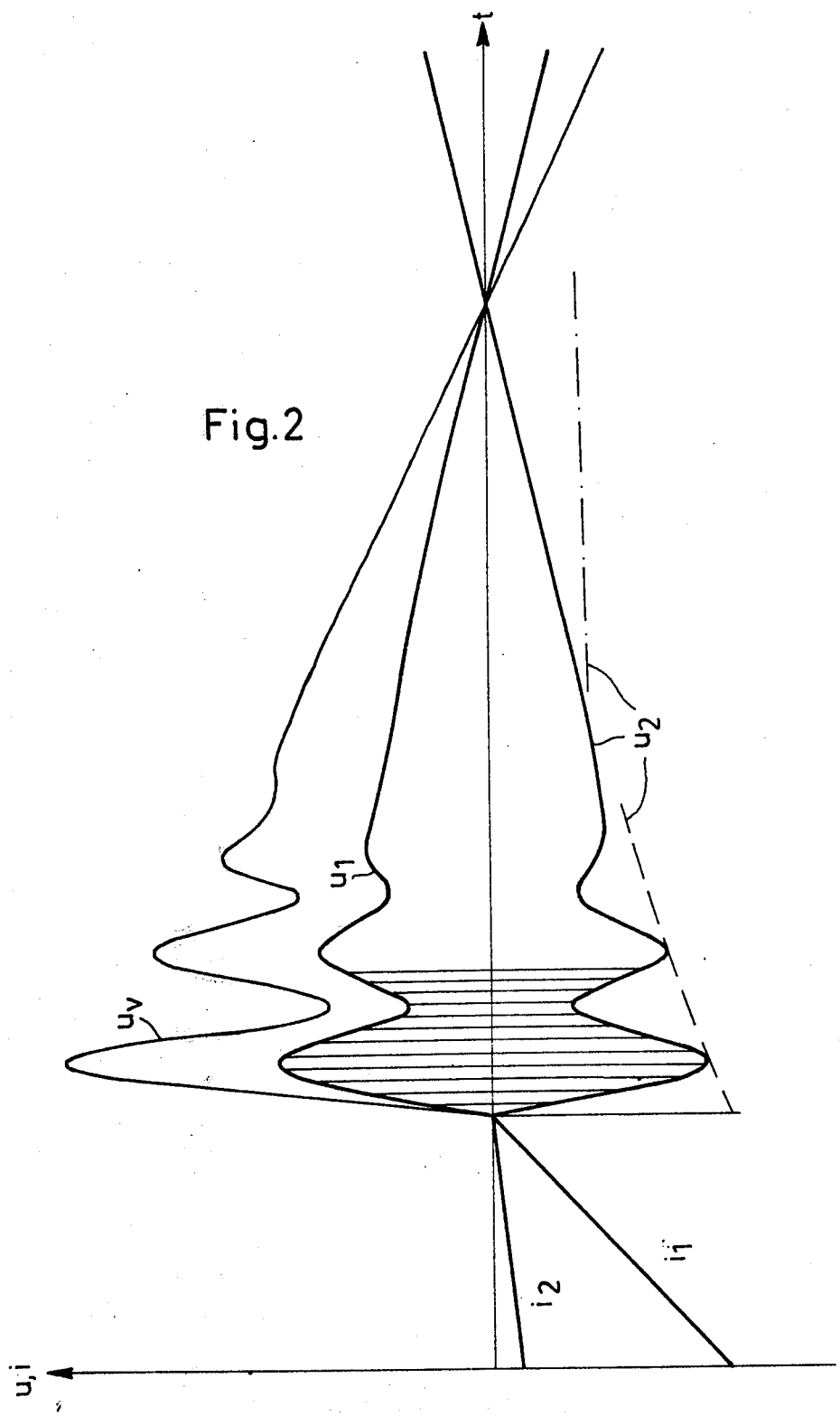
FIG. 2 shows waveforms for currents and voltages in the circuit of FIG. 1.

FIG. 2 illustrates the waveforms of the test voltages present in the test circuit of the invention for a full-pole and a partial-pole test. It can be seen from such waveforms that in lieu of designing a test circuit for generating a voltage $u_v$ for a full-pole test, the expense of the synthetic test circuit of the present invention is kept low by making use of the difference voltage between the partial-pole test voltage $u_1$ and the voltage $u_2$ generated by the high-voltage circuit 15. The waveforms further illustrate the short-circuit break current $i_1$ and a further current $i_2$ which flows in the circuit including the source 15. The voltage $u_v$ is in substance given by test specifications, while the voltage $u_1$ is given by existing test circuits. These curves correspond to Oscillograms recorded during the testing procedure. The test sample i.e., the high voltage circuit breaker, is connected to the synthetic test circuit and charged with the power for which it is designed. during testing two essential possibilities exist:

Either the switch switches off the power with which it is charged with a positive result, in which case it is in order; or it is unable to quench the art formed during switching i.e., it does not turn itself off and fails in which case the result is negative. The exact capacities utilized during testing depend on the type of circuit breaker and on the requirements of the power company who intends to use the switch. Basically, more information concerning methods in general and requirements for different types of switches is described in publication 427 of the International Electrotechnical Commission, 1973.

Figure 3:
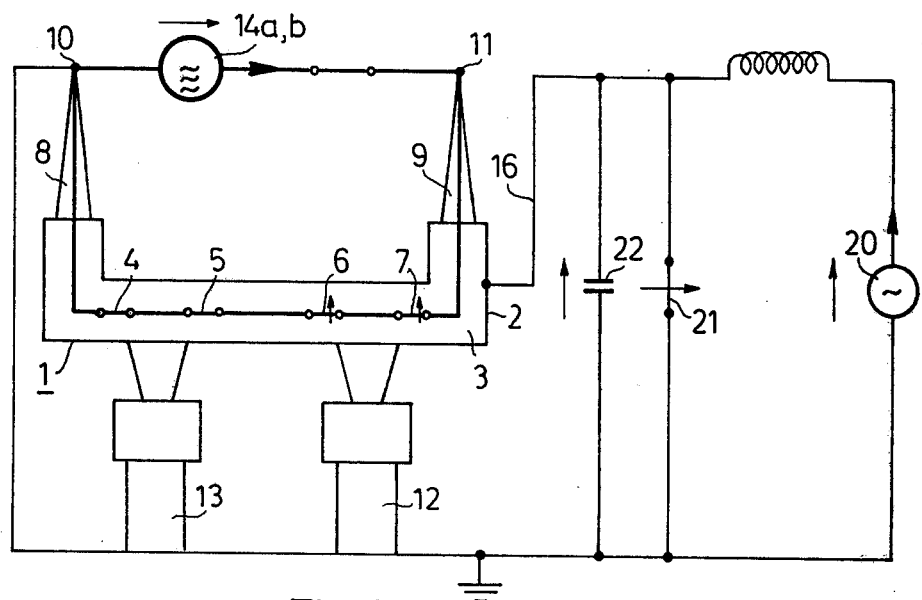
FIGS. 3 to 6 illustrate further embodiments of a synthetic test circuit in accordance with the invention.
Figure 4:
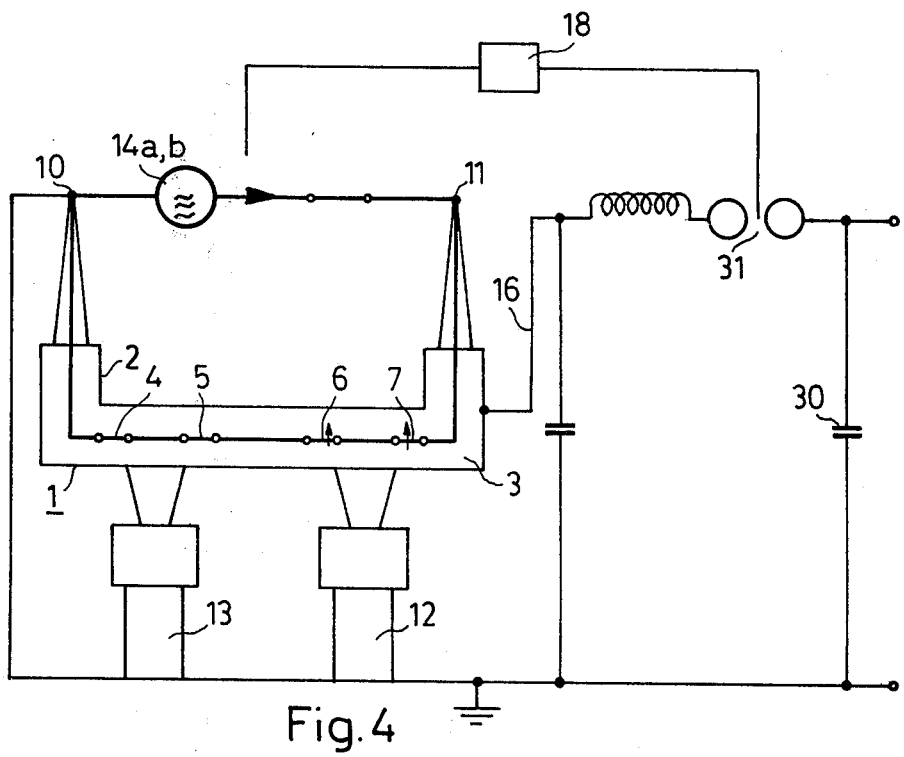

FIG. 3 illustrates a further embodiment of a synthetic test circuit for testing the breaker 1 of FIG. 1. The test circuit of FIG. 2 differs from the circuit of FIG. 1 in that the added high-voltage circuit thereof comprises a high-voltage generator 20 which via an auxiliary switch 21, supplies energy contained in the high-voltage circuit, to a capacitor 22, which is connected between the metal encapsulation 2 and ground potential.

FIG. 3 shows yet another synthetic test circuit for use in testing the breaker of FIG. 1, in which the high-voltage circuit contains a capacitor battery 30 which is connected via an ignition spark gap 31 to the encapsulation 2 and is controlled by the control unit 18.

Figure 5:
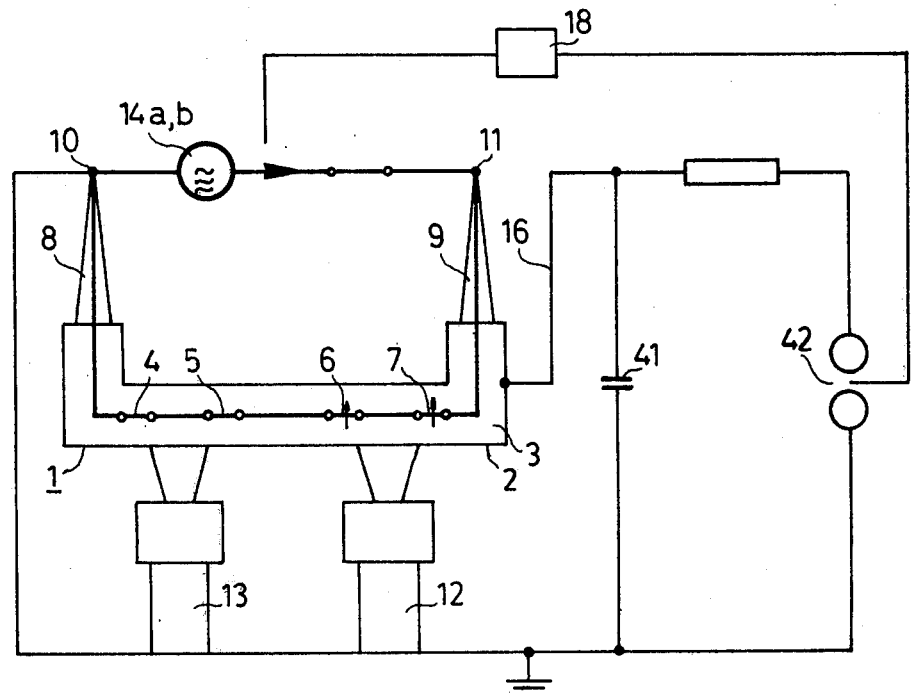

FIG. 5 shows a further embodiment of the synthetic test circuit of the invention. In this embodiment, the high-voltage circuit includes a capacitor 41 which supplies a high voltage, via a switching spark gap 42 controlled by the control device 18, to the encapsulation 2.

Figure 6:
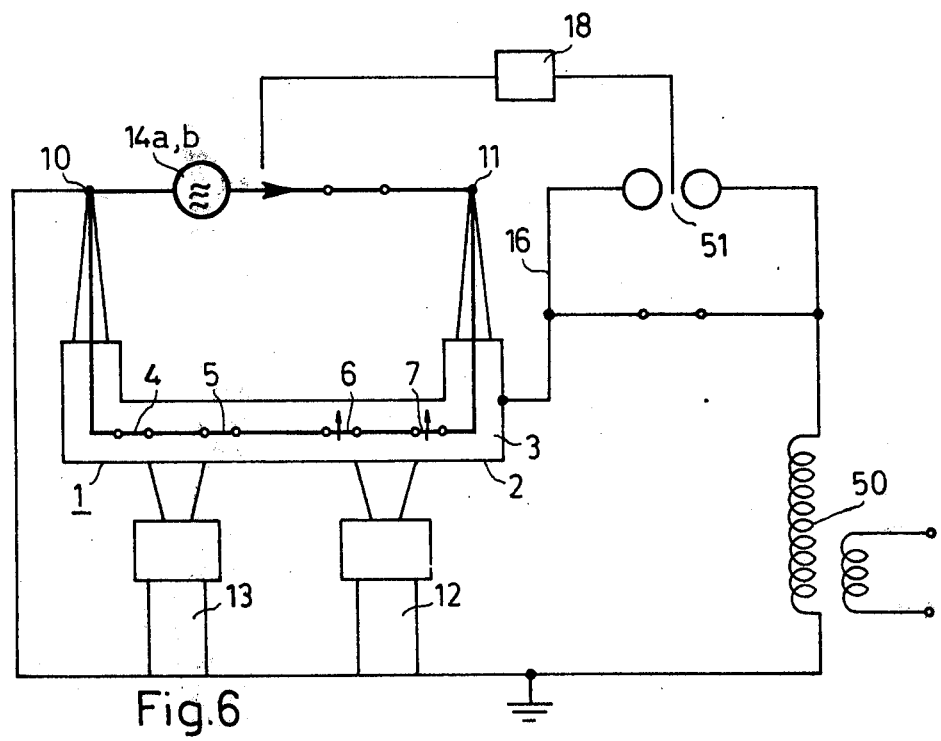

FIG. 6 shows a final embodiment of the present synthetic test circuit wherein the high-voltage circuit thereof comprises a transformer 50 which applies a high voltage to the encapsulation 2 via a spark gap 51.

What is claimed is:

1. In a synthetic test circuit for use in testing a metal encapsulated high-voltage circuit breaker which is grounded on one side and which includes several switching gaps arranged in series within said encapsulation, the test circuit including a high-voltage source and a high current source for stressing the switching gaps being operated during testing, the improvement comprising:

high-voltage means for stressing the insulation within the interior of said encapsulation;

control means coupled to said high-voltage means and to said high-voltage source for causing application of high-voltage from said high-voltage means between ground and said encapsulation simutaneously with the application of a further voltage generated by said high-voltage source and applied between a contact of an open one of said gaps and ground, said high-voltage being of opposite polarity to said further voltage and said encapsulation being insulated from ground potential during application thereof.

2. In a test circuit in accordance with claim 1, the improvement wherein:

said high-voltage means includes a high voltage generator.

3. In a test circuit in accordance with claim 1, the improvement wherein:

said high-voltage means includes a capacitor battery.

4. In a test circuit in accordance with claim 1, the improvement wherein said high-voltage means includes:

a transformer;

and a high-voltage source feeding said transformer.

* * * * *